United States Patent [19]
Kim et al.

[11] Patent Number: 5,748,450
[45] Date of Patent: May 5, 1998

[54] BGA PACKAGE USING A DUMMY BALL AND A REPAIRING METHOD THEREOF

[75] Inventors: Young-Gon Kim; Dong-You Kim, both of Choongchungbook-Do, Rep. of Korea

[73] Assignee: LG Semicon Co., Ltd., Cheongju, Rep. of Korea

[21] Appl. No.: 636,441

[22] Filed: Apr. 23, 1996

[30] Foreign Application Priority Data

Oct. 19, 1995 [KR] Rep. of Korea ............... 36169/1995

[51] Int. Cl.$^6$ .............................. H05K 7/02; H01R 9/09
[52] U.S. Cl. .................. 361/777; 174/261; 257/738; 361/774; 361/779; 361/805; 361/767
[58] Field of Search ................... 174/250, 261, 174/254, 260; 228/180.21, 180.22; 257/209, 529, 530, 665, 786, 700, 738, 788; 361/760, 767, 772, 774, 777, 778, 779, 781, 792, 805, 806; 438/129–132, 600, 601, 922, 343, 369; 439/43, 68, 83

[56] References Cited

U.S. PATENT DOCUMENTS

| | | | |
|---|---|---|---|
| 4,150,421 | 4/1979 | Nishihara et al. | 361/777 |
| 4,700,016 | 10/1987 | Hitchcock et al. | 361/805 |
| 4,829,404 | 5/1989 | Jensen | 361/805 |
| 4,862,248 | 8/1989 | Zeile et al. | 257/738 |
| 4,888,665 | 12/1989 | Smith | 361/805 |
| 5,081,561 | 1/1992 | Smith | 361/805 |
| 5,220,490 | 6/1993 | Weigler et al. | 361/777 |
| 5,224,022 | 6/1993 | Weigler et al. | 361/777 |
| 5,243,140 | 9/1993 | Bhatia et al. | 361/777 |
| 5,264,664 | 11/1993 | McAllister et al. | 361/777 |
| 5,381,307 | 1/1995 | Hertz et al. | 361/777 |

Primary Examiner—Donald Sparks
Attorney, Agent, or Firm—Fleshner & Kim

[57] ABSTRACT

In a BGA package having electrically connected active balls and electrically disconnected dummy balls, the active balls are positioned in a radial direction at intervals of 90° around the dummy balls. When a defect occurs in a solder joint, the package can be easily repaired by finding defective active ball; forming a repair hole by using a cutting means at a predetermined portion of the printed circuit board corresponding to a central position between the dummy ball and the defectively soldered active ball; inserting a solder paste injector into the repair hole to inject solder thereinto; and mutually connecting pad extensions of the dummy ball and the defective active ball with the injected solder. Therefore, the overall process can be simplified and its reliability can be improved.

18 Claims, 3 Drawing Sheets

BGA PACKAGE USING A DUMMY BALL AND A REPAIRING METHOD THEREOF

BACKGROUND OF THE INVENTION

1. Field of the Invention

The present invention relates to a BGA (Ball Grid Arrays) package using a dummy ball and a repairing method thereof capable of performing a local repairing of a solder joint.

2. Description of the Prior Art

Referring to FIG. 1, in a conventional BGA package, a predetermined thickness of solder resist film 9 is bonded at a front and rear surface of a substrate 1. A semiconductor chip 3 is bonded at a central part of the substrate 1 by using an adhesive (not shown), and penetration holes 8 are formed at a predetermined portion of the substrate 1. Conductive patterns 5 are formed in each of the penetration holes 8 in the substrate for an electrical connection between the upper and lower portions thereof. Wires 4 are connected at one end thereof to an upper surface 5a of the conductive patterns 5 and at their other ends to pads 3a of the semiconductor chip 3. A plurality of solder balls 6 are formed at a predetermined portion of a lower surface 5b of the respective conductive patterns 5.

After the wires 4 are connected, the BGA package is molded by an EMC (Epoxy Molding Compound) 7, and the plurality of solder balls 6 are arranged at regular intervals at the lower surface of the substrate 1 and are reflowed so as to be mounted.

FIG. 2 is a cross-sectional view of a conventional BGA package mounted to a printed circuit board (PCB).

First, in order to mount the BGA package on the printed circuit board, the BGA package as shown in FIG. 1 is aligned on the printed circuit board 10 and reflowed so that the solder balls 6 of the BGA package are electrically connected to pads 10a formed on the printed circuit board 10.

However, the BGA package manufactured by the steps described above wholly depends upon the soldering step in view of its reliability. In the meantime, when a defect is found in an electrical testing, it requires a method which removes the entire BGA package under the condition that its temperature is raised, resulting in a disadvantage in that repairs are not easy.

In addition, in the BGA package, in case that the solder balls are not properly connected to the printed circuit board, highly increased impedance value appears in an external electrical testing. In this case, in spite of a partial inferiority of the solder balls, the BGA package should be removed after all of the solder balls are melted, and then, a cleaning step is performed, and thereafter a new BGA package is mounted, so that the overall process becomes complicated.

SUMMARY OF THE INVENTION

Therefore, an object of the present invention is to provide a BGA package using a dummy ball and a repairing method therefor whereby when a solder joint defect occurs in a BGA package, a partial repairing can be performed by using the dummy ball and a conductive material.

In order to attain the above object, there is provided a BGA package using a dummy ball which dummy ball need not be electrically connected among conductive balls and which dummy ball is disposed at a central part of an array of active balls which are arranged in a radial manner at intervals around the dummy ball.

In order to achieve the above objects, a plurality of dummy balls is provided on the substrate, and dummy balls replace active balls with defects so as to electrically connect a first substrate to a second substrate. Further, the number of dummy balls is less than the number of active balls. The number of dummy balls can be determined by the size or area of the first substrate and the number and location of the defective balls.

In order to attain the above object, there is also provided a method for repairing the BGA package using the dummy ball including the steps of: finding defective active balls by using a checker; forming a repair hole by using a cutting means at a predetermined portion of a printed circuit board corresponding to a central part of an array of a dummy ball and active balls; inserting a solder paste injector to the repair hole to inject solder thereto; and mutually connecting pad extensions of the dummy ball and the active balls with each solder.

DETAILED DESCRIPTION OF THE INVENTION

A preferred embodiment of the present invention will now be described in detail with reference to the accompanying drawings.

Because the parts other than the structure of a printed circuit board placed adjacent to conductive balls are similar to those of the previously described conventional art, description thereof is only briefly made as follows.

Figure 3:
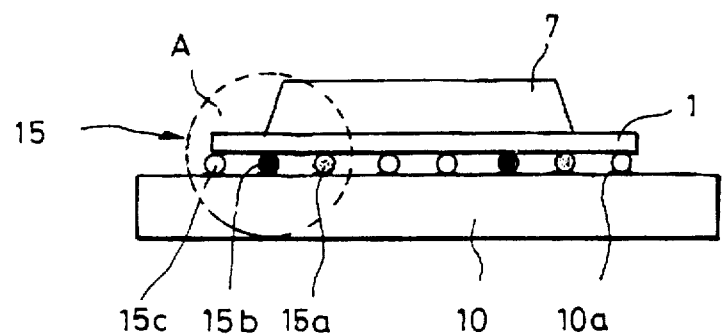
FIG. 3 is a cross-sectional view showing a state wherein a BGA package having dummy balls is bonded on a printed circuit board for mounting components in accordance with an embodiment of the present invention.

FIG. 3 is a cross-sectional view showing a state wherein a BGA package having dummy balls is bonded on the printed circuit board for mounting components in accordance with the embodiment of the present invention. As shown in this figure, a plurality of conductive balls 15 is formed at the portion "A" between a substrate 1 and a printed circuit board 10. The conductive balls 15 include a dummy ball 15a shown as a dotted circle, defective active ball 15b shown as a black-colored circle, and an active ball 15c shown as a white-colored circle.

The dummy ball 15a is conductive and is attached on the printed circuit board 10 of the BGA package, with no connection to a pad (not shown) of a semiconductor chip 7.

In this preferred embodiment, as shown in FIG. 3, the black-colored defective active ball 15b is to be repaired so as to perform the same function as the normal active ball 15c.

On the printed circuit board 10 in accordance with the preferred embodiment of the present invention, circuit patterns are formed corresponding to the plurality of conductive balls 15.

Figure 4:
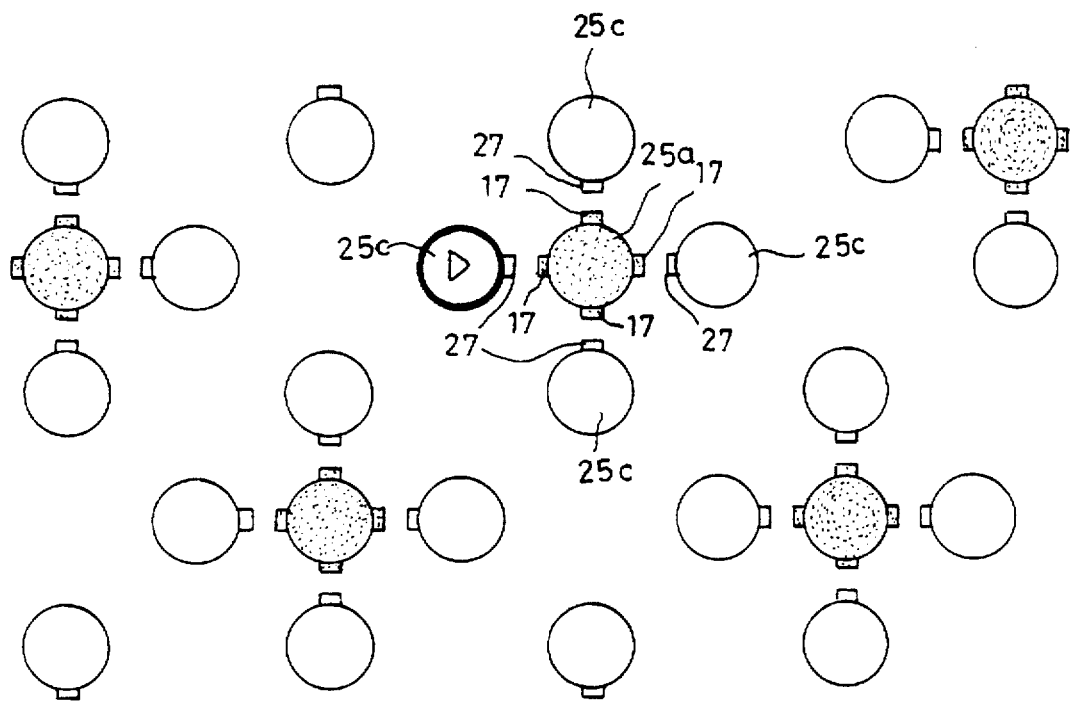
FIG. 4 is an enlarged plan view of the printed circuit board on which the BGA package is mounted corresponding to the portion "A" in FIG. 3.

The circuit patterns include, as shown in FIG. 4, a circuit pattern 25a to be connected to the dummy ball 15a (referring to FIG. 3), and a plurality of circuit patterns 25c to be connected to the corresponding active balls 15c (referring to FIG. 3) arranged to the circuit pattern 25a. In this example, the plurality of circuit patterns 25 and corresponding active balls 15b and 15c are arranged in a radial manner at the interval of 90° of the circuit pattern 25a and corresponding dummy ball 15a, respectively.

That is, in the BGA package, a solder paste (not shown) is deposited at a pad 10a formed at an upper part of the printed circuit board 10, so that the BGA package is bonded through a reflow process.

Figure 1:
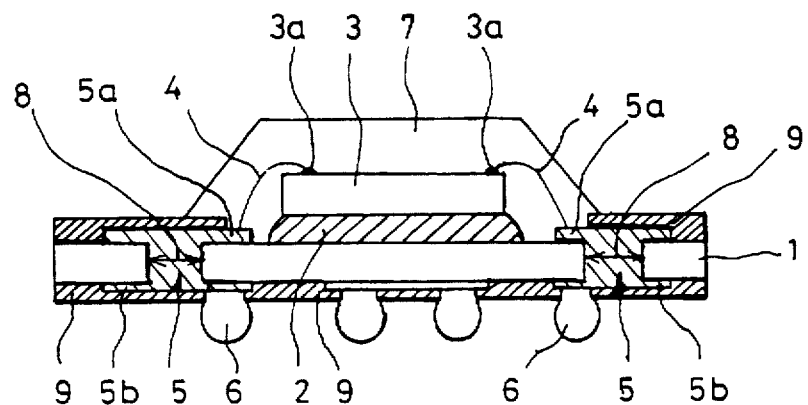
FIG. 1 is a schematic view of a conventional BGA package.
Figure 2:
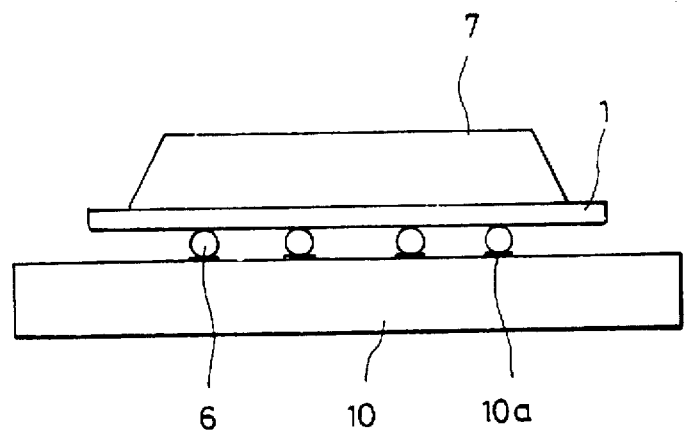
FIG. 2 is a cross-sectional view showing a state wherein the conventional BGA package is bonded on a printed circuit board for mounting components.

In FIG. 3, reference numeral 7 denotes the same epoxy molding compound (EMC) as shown in FIG. 2.

FIG. 4 is an enlarged plan view of the printed circuit board on which the BGA package is mounted corresponding to the portion "A" in FIG. 3. As shown in FIG. 4, circuit patterns 25c to which the plurality of active balls are to be connected are arranged at the peripheral portion of the circuit pattern 25a to which the dummy ball is to be connected. As to those circuit patterns, a user can use partially or all of the circuit patterns 25a for the dummy balls except the circuit pattern 25c for a predetermined active balls in designing them, for which the arranging method and number may be adjusted to meet a requirement of the user. This embodiment provides one circuit pattern 25a to be connected to one dummy ball for each four of the circuit patterns 25c connected to four active balls.

Pad extensions 17 are integrally formed at the outer peripheral portion of each circuit pattern 25a to which the dummy ball is to be connected, and pad extensions 27 are formed facing the pad extension 17 of the dummy balls 15a at the outer peripheral portion of each circuit pattern 25c to which the active balls are to be connected.

Figure 5:
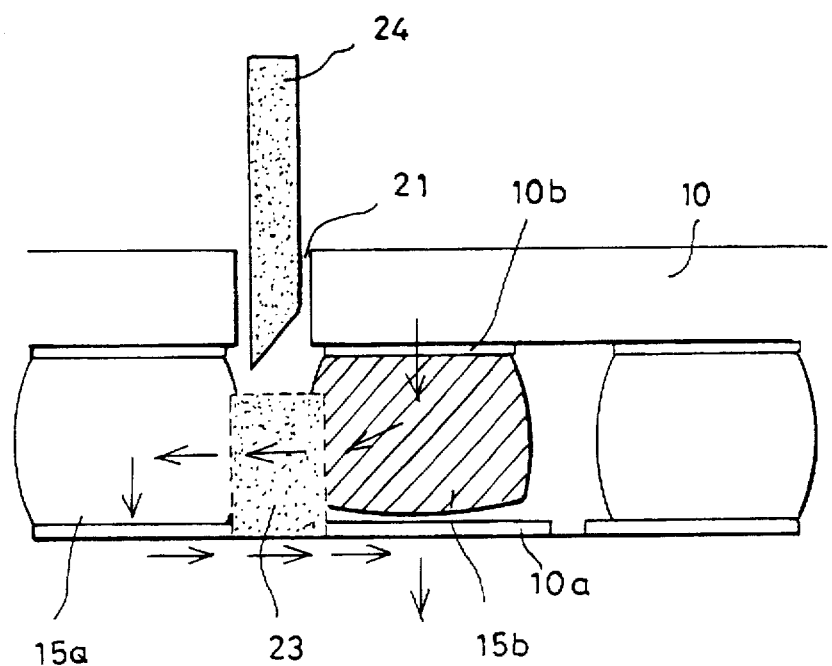
FIG. 5 is a cross-sectional view showing a state of repairing the BGA package having an inferior solder joint.

Referring to FIG. 5, assuming that defective active ball 15b (referring to FIG. 3) is positioned at the circuit pattern 25c to which the active ball is to be connected as represented by "D" in FIG. 4, its repair is performed as follows.

First, in testing electrical characteristics, a checker (not shown) finds defective active ball 15b at the BGA package (referring to FIGS. 3 and 5). Then, the user will find the circuit pattern 25a, to which a dummy ball is connected, disposed at the vicinity of the circuit pattern 25c (in this respect, it means the circuit pattern 25c corresponding to "D" among the plurality of the circuit patterns 25c in FIG. 4) to which the defective active ball 15a is to be connected.

Thereafter, the user drills a repair hole 21 by using a micro-drill or other cutting tool (not shown) at a predetermined portion of the printed circuit board 10. And then, after a solder paste injector 24 is inserted to the repair hole 21 toward the active ball 15b, the solder 23 is injected. As to the repair hole 21, even though only one entry direction is shown in FIG. 5 as a matter of convenience, both directions may be used as the circumstances are require. The amount of the solder 23 injected is preferably to the extent sufficient that the pad extension 17 of the dummy ball 15a and the pad extension 27 of the active ball 15c can be mutually connected. However, in case that an area of the BGA package is made to be small, the pad extensions 17 and 27 are not necessary to be used, so that it is then preferable that the dummy ball 15a and the active ball 15c are used by connecting to each other in a range of 1:1 equivalence. Reference numeral 10b in FIG. 5 denotes a pad similar to the pad 10a in FIG. 3.

In the meantime, after being repaired as shown in FIG. 5, a current flows in the direction of the arrows shown in FIG. 5. The current flows through the dummy ball 15a and the solder 23 without passing to the pad 10a due to the defective active ball 15b. The pad extension 17 of the dummy ball 15a helps the injected solder 23 be placed at an accurate position and the balls be connected with a smaller solder injection amount.

In order to inject the solder 23, the repair hole 21 is to be drilled on the printed circuit board as shown in FIG. 5, the position of which needs to be designed so as not to pass through any signal or power patterns.

As so far described, according to the BGA package in accordance with the preferred embodiment of the present invention, the overall package need not be removed and can be simply repaired by using the dummy balls. Also, in repairing the BGA package, only the corresponding portion in question found to be defective can be repaired, so that the overall process can be reduced and its reliability can be highly improved.

What is claimed is:

1. In a ball-grid-array (BGA) package having a semiconductor package of which an electrical connection terminal is exposed at a lower surface of an epoxy molding compound; an insulating film having a plurality of conductive solder balls, an upper surface of the plurality of conductive solder balls being electrically connected to the semiconductor package; and a printed circuit board being electrically connected to a lower surface of said solder balls;

a dummy conductive solder ball not electrically connected among said plurality of conductive solder balls and disposed at a central part of an array of active ones of said conductive solder balls which are arranged in a radial manner at intervals of 90° around the dummy ball.

2. The BGA package according to claim 1, wherein repair pad extensions are formed respectively facing to each other at one side of each circuit pattern of the printed circuit board to which the active balls and the dummy ball are connected.

3. The BGA package according to claim 1, wherein the dummy ball does not have any signal or power patterns at its formation location.

4. A semiconductor package comprising:
a substrate having first and second surfaces;
a semiconductor chip coupled to said first surface of the substrate;
a plurality of active conductive elements coupled to said second surface of said substrate and conductively coupled to said semiconductor chip; and
at least one dummy conductive element coupled to said second surface of the substrate, electrically isolated from said semiconductor chip, and positioned near at least one corresponding active conductive element.

5. The semiconductor package of claim 4, wherein said plurality of conductive elements and said at least one dummy conductive element are protrusions which extend beyond the second surface of said substrate.

6. The semiconductor package of claim 5, wherein said protrusions are approximately ball shaped.

7. The semiconductor package of claim 5, wherein said protrusions are solder balls.

8. The semiconductor package of claim 4, wherein a number of dummy conductive elements are less than a number of active conductive elements.

9. The semiconductor package of claim 8, wherein a ratio of dummy conductive elements to said active conductive elements is about 1:4.

10. A semiconductor assembly comprising:
a) a semiconductor package having a substrate having first and second surfaces, a semiconductor chip coupled to said first surface of the substrate, a plurality of active conductive elements coupled to said second surface of said substrate and conductively coupled to said semiconductor chip, and a plurality of dummy conductive elements coupled to said second surface of the substrate, electrically isolated from said semiconductor chip, and each positioned near corresponding active conductive elements; and b) a printed circuit board upon which said semiconductor package is mounted.

11. The semiconductor assembly of claim 10, wherein an opening is positioned between one of said plurality of active conductive elements and a corresponding dummy conductive element.

12. The semicondutor assembly of claim 11, wherein one of said pluraliy of conductive elements is defective such that a connection is broken between said semiconductor chip and a corresponding electrical terminal of said printed circuit board.

13. The semiconductor assembly of claim 12, wherein a conductive material injected into said opening allows interconnection between said defective active conductive element and said corresponding dummy conductive element.

14. The semiconductor assembly of claim 10, wherein said pluraliy of conductive elements and said at least one dummy conductive element are protrusions which beyond the second surface of said substrate.

15. The semiconductor assembly of claim 14, wherein said protrusions are approximately ball shaped.

16. The semiconductor assembly of claim 14, wherein said protrusions are solder balls.

17. The semiconductor assembly of claim 10, wherein a number of dummy conductive elements are less than a number of active conductive elements.

18. The semiconductor assembly of claim 17, wherein a ratio of dummy conductive elements to said active conductive elements is about 1:4.

* * * * *